(12) United States Patent
Nakajima et al.

(10) Patent No.: US 8,503,181 B2
(45) Date of Patent: Aug. 6, 2013

(54) SEMICONDUCTOR DEVICE WITH A ZIGZAG RADIATOR

(75) Inventors: Kiyofumi Nakajima, Toyota (JP); Hiroshi Osada, Komaki (JP); Yukio Miyachi, Owariasahi (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 121 days.

(21) Appl. No.: 13/059,664

(22) PCT Filed: Aug. 27, 2009

(86) PCT No.: PCT/JP2009/064982
§ 371 (c)(1),
(2), (4) Date: Feb. 18, 2011

(87) PCT Pub. No.: WO2010/024343
PCT Pub. Date: Mar. 4, 2010

(65) Prior Publication Data
US 2011/0134608 A1    Jun. 9, 2011

(30) Foreign Application Priority Data
Aug. 28, 2008    (JP) .................... 2008-219426

(51) Int. Cl.
*H05K 7/20* (2006.01)
*H01L 23/48* (2006.01)

(52) U.S. Cl.
USPC ......................................... 361/709; 257/717

(58) Field of Classification Search
None
See application file for complete search history.

(56) References Cited

U.S. PATENT DOCUMENTS

| 5,574,626 | A | * | 11/1996 | Smith .......................... 361/204 |
| 6,385,047 | B1 | * | 5/2002 | McCullough et al. ........ 361/704 |
| 6,882,535 | B2 | * | 4/2005 | Labanok et al. ............... 361/704 |
| 7,202,559 | B2 | * | 4/2007 | Zhao et al. ..................... 257/707 |
| 2005/0112796 | A1 | * | 5/2005 | Ararao et al. ................... 438/106 |
| 2005/0178533 | A1 | * | 8/2005 | Minamitani et al. ...... 165/104.33 |
| 2007/0297145 | A1 | * | 12/2007 | Karrer et al. ................... 361/720 |
| 2008/0160246 | A1 | | 7/2008 | Buhler et al. |
| 2009/0205802 | A1 | | 8/2009 | Yoshida et al. |

FOREIGN PATENT DOCUMENTS

| JP | 11177019 A | 7/1999 |
| JP | 2005259748 A | 9/2005 |
| JP | 2006294971 A | 10/2006 |
| JP | 2007129150 A | 5/2007 |
| JP | 2008021721 A | 1/2008 |
| JP | 2008112967 A | 5/2008 |

OTHER PUBLICATIONS

Japanese Office Action (and English Translation) mailing date of May 8, 2012, for JP Patent Application No. 2008-219426 (4 pages).

* cited by examiner

*Primary Examiner* — Lisa Lea Edmonds
*Assistant Examiner* — Xanthia C Cunningham
(74) *Attorney, Agent, or Firm* — Gifford, Krass, Sprinkle, Anderson & Citkowski, P.C.

(57) ABSTRACT

A semiconductor apparatus 10 includes a radiator 30 on which plural semiconductor modules 20 that include semiconductor elements 21 are mounted, the semiconductor apparatus 10 characterized by the radiator 30 including a first main surface 30B and a second main surface 30C configured to be located on the opposite side of the first main surface 30B. Semiconductor module mount-surfaces 30B1, 30B2, 30C1, 30C2 are arranged in the first main surface 30B and the second main surface 30C in a zigzag pattern in cross-sectional view; and the semiconductor modules 20 are mounted onto some or all of the semiconductor module mount-surfaces 30B1, 30B2, 30C1, 30C2.

9 Claims, 10 Drawing Sheets

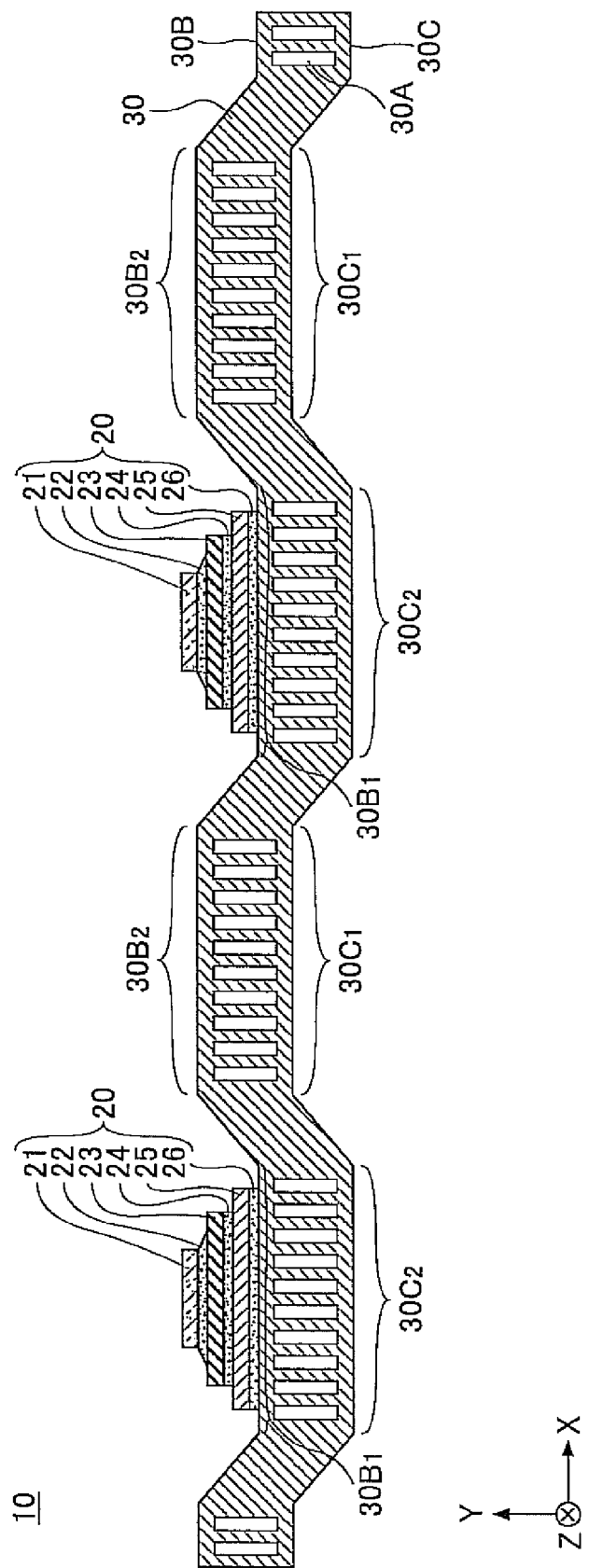

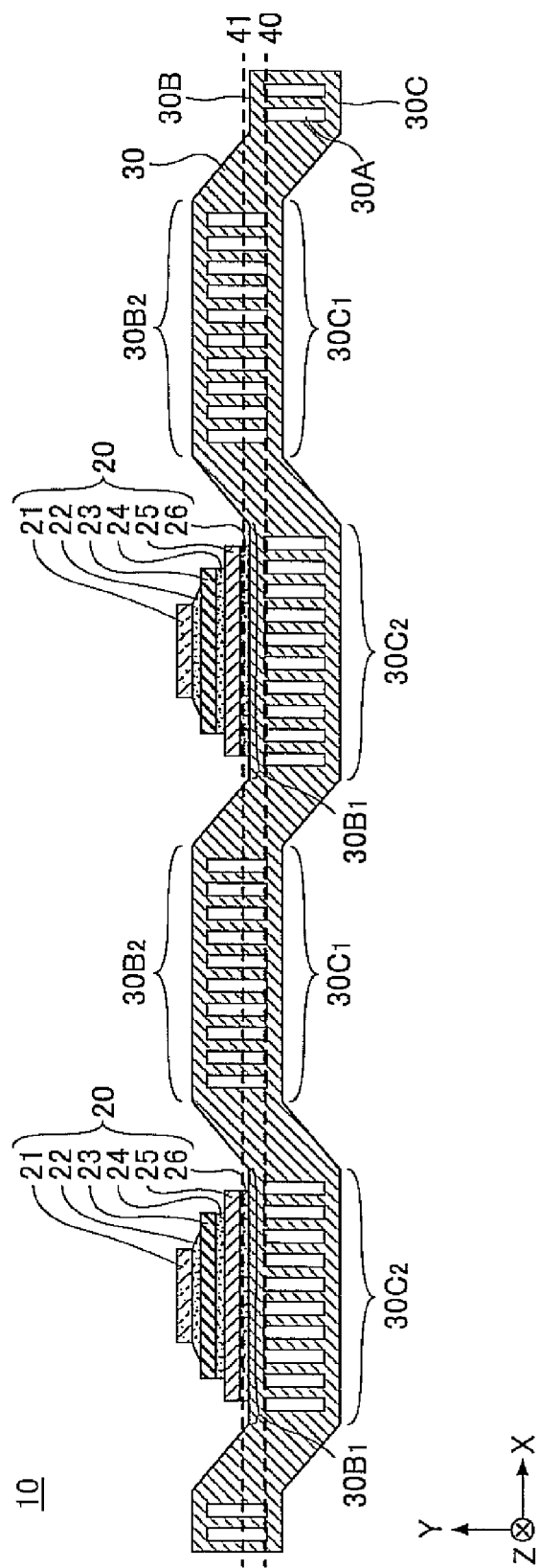

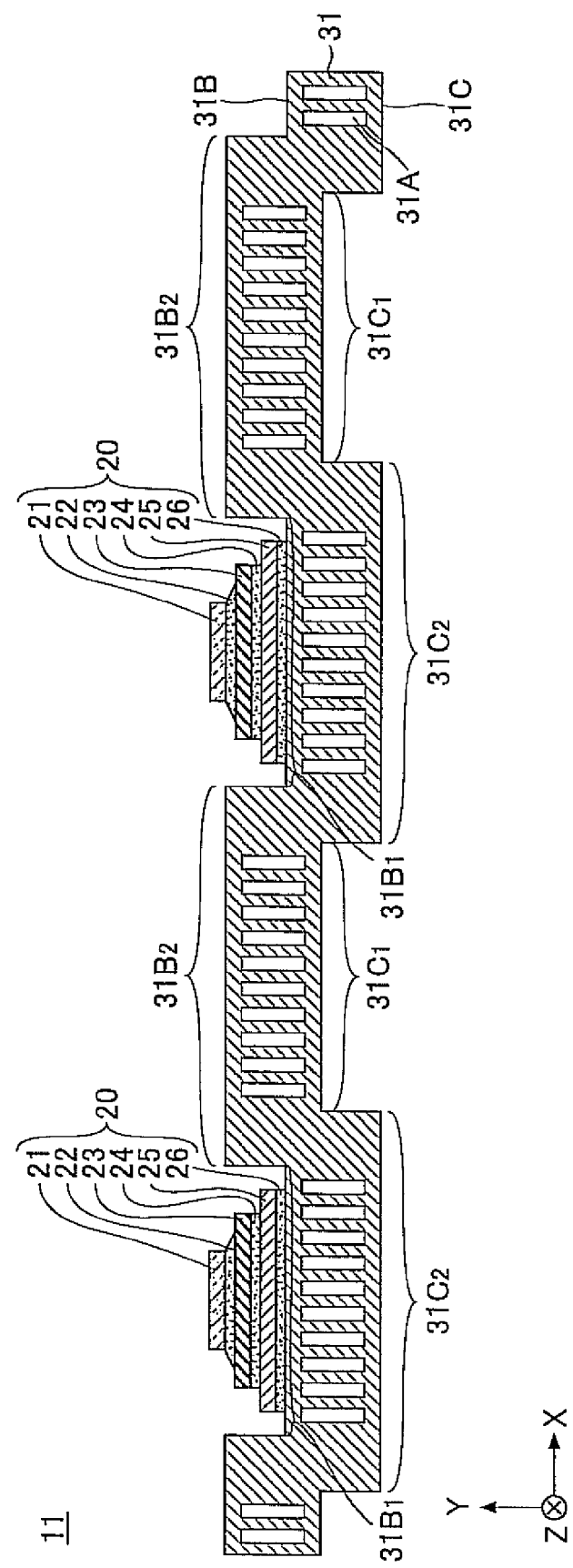

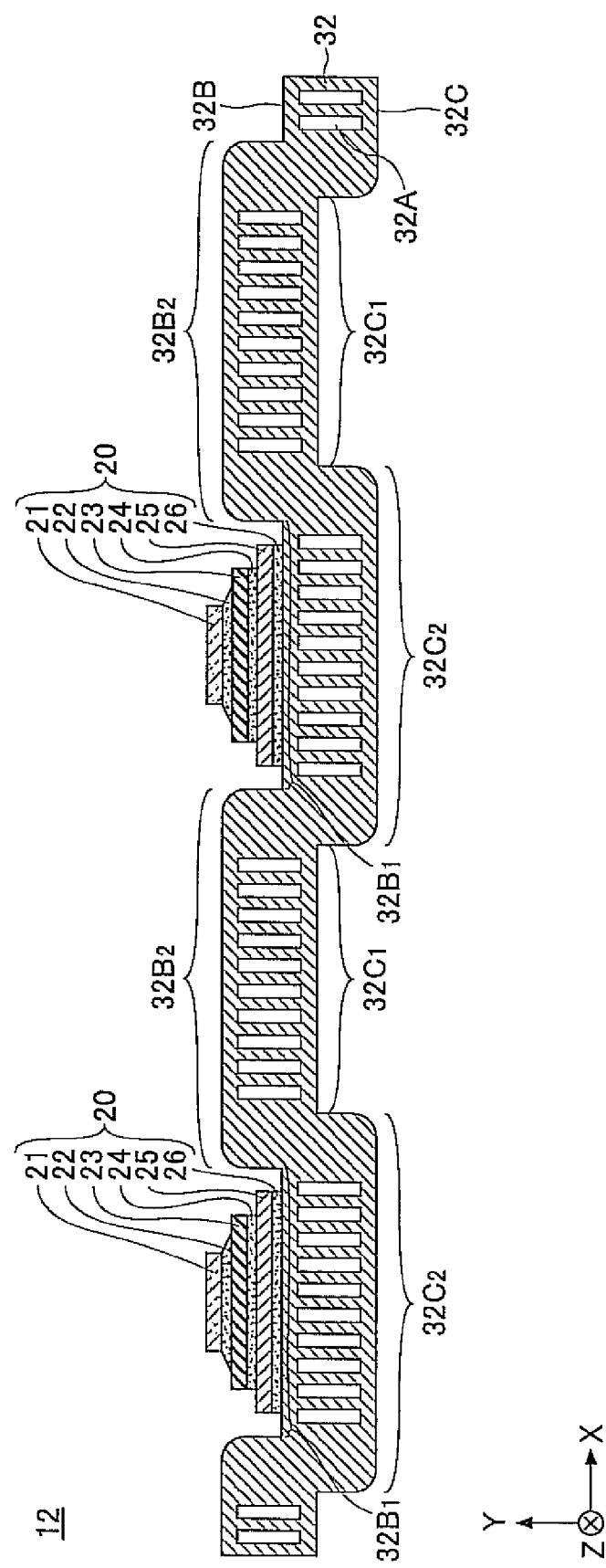

SEMICONDUCTOR DEVICE WITH A ZIGZAG RADIATOR

TECHNICAL FIELD

The present invention relates to a semiconductor apparatus which includes a radiator on which plural semiconductor modules that include semiconductor elements are mounted.

BACKGROUND ART

Conventionally, various kinds of semiconductor apparatuses which include semiconductor elements have been known. For example, a semiconductor apparatus that has a configuration in which a radiator plate and a radiator are mounted on an insulated substrate via a bonding material has been known. As an example, a semiconductor apparatus which includes a radiator in which a flow path of a cooling medium is formed, and a restrain member which restrains warping of the radiator has been known. As another example, a semiconductor apparatus that has a concave portion which is formed on a main surface of a radiator and in which a semiconductor element is mounted via an insulated heat conductive film has been known (see, e.g., Patent Documents 1 and 2).

Patent Document 1: Japanese Laid-Open Patent Application No. 2006-294971

Patent Document 1: Japanese Laid-Open Patent Application No. 2007-129150

DISCLOSURE OF INVENTION

Problem to be Solved by the Invention

Since the conventional semiconductor apparatus includes a difference of linear expansion coefficients or the like between the radiator and the radiator plate, the radiator may be warped. As a result, there is a problem in that the semiconductor element and the bonding material may be subjected to stress and may be cracked.

Thus, it is an object of the present invention to provide a semiconductor apparatus in which a semiconductor element and a bonding material may not easily be cracked.

Means for Solving the Problems

In a first aspect of the present invention, in order to achieve the object as described above, a semiconductor apparatus includes a radiator on which plural semiconductor modules that include semiconductor elements are mounted, the semiconductor apparatus characterized by the radiator including a first main surface and a second main surface configured to be located on the opposite side of the first main surface, wherein semiconductor module mount-surfaces are arranged in the first main surface and the second main surface in a zigzag pattern in cross-sectional view; and the semiconductor modules are mounted onto some or all of the semiconductor module mount-surfaces.

In a second aspect of the present invention, in the semiconductor apparatus according to the first aspect, the semiconductor modules are mounted only onto the semiconductor module mount-surfaces located in bottom surfaces of concave portions of the first main surface in cross-sectional view, or mounted only onto the semiconductor module mount-surfaces located in bottom surfaces of concave portions of the second main surface in cross-sectional view.

In a third aspect of the present invention, in the semiconductor apparatus according to the first aspect, the semiconductor modules are mounted onto the semiconductor module mount-surfaces located in bottom surfaces of concave portions and the semiconductor module mount-surfaces located in top surfaces of convex portions of the first main surface in cross-sectional view, or mounted onto the semiconductor module mount-surfaces located in bottom surfaces of concave portions and the semiconductor module mount-surfaces located in top surfaces of convex portions of the second main surface in cross-sectional view.

In a fourth aspect of the present invention, in the semiconductor apparatus according to the first aspect, the semiconductor modules are mounted onto the semiconductor module mount-surfaces located in bottom surfaces of concave portions of the first main surface in cross-sectional view, and mounted onto the semiconductor module mount-surfaces located in bottom surfaces of concave portions of the second main surface in cross-sectional view.

In a fifth aspect of the present invention, in the semiconductor apparatus according to the first aspect, a cross-sectional shape of the radiator is almost symmetrical about a point.

In a sixth aspect of the present invention, in the semiconductor apparatus according to the first aspect, a volume of one side of a stress-neutral plane of the radiator is almost equal to a volume of the other side of the stress-neutral plane of the radiator.

In a seventh aspect of the present invention, in the semiconductor apparatus according to the first aspect, the semiconductor module mount-surfaces are formed periodically.

In an eighth aspect of the present invention, in the semiconductor apparatus according to the first aspect, shapes of boundaries between concave portions of the first main surfaces and the second main surfaces in cross-sectional view, and convex portions located adjacent to the concave portions in cross-sectional view are step-like shapes.

In a ninth aspect of the present invention, in the semiconductor apparatus according to the first aspect, the semiconductor module includes the semiconductor element, an insulated substrate, a radiator plate and bonding material configured to be bonded therebetween.

In a tenth aspect of the present invention, in the semiconductor apparatus according to the ninth aspect, the bonding materials are constituted of solder or braze.

Effects of the Invention

In accordance with the present invention, a semiconductor apparatus in which a semiconductor element and a bonding material may not easily be cracked can be provided.

BRIEF DESCRIPTION OF THE DRAWINGS

FIG. 1 shows an exemplary cross-sectional view of a semiconductor apparatus 10 according to embodiment 1 of the present invention;

FIG. 3B shows a cross-sectional view in which exemplary levels of stress-neutral planes are shown;

FIG. 4 shows an exemplary cross-sectional view of a semiconductor apparatus 11 according to a first variation of embodiment 1 of the present invention;

FIG. 5 shows an exemplary cross-sectional view of a semiconductor apparatus 12 according to a second variation of embodiment 1 of the present invention;

BEST MODE FOR CARRYING OUT THE INVENTION

Figure 2A:
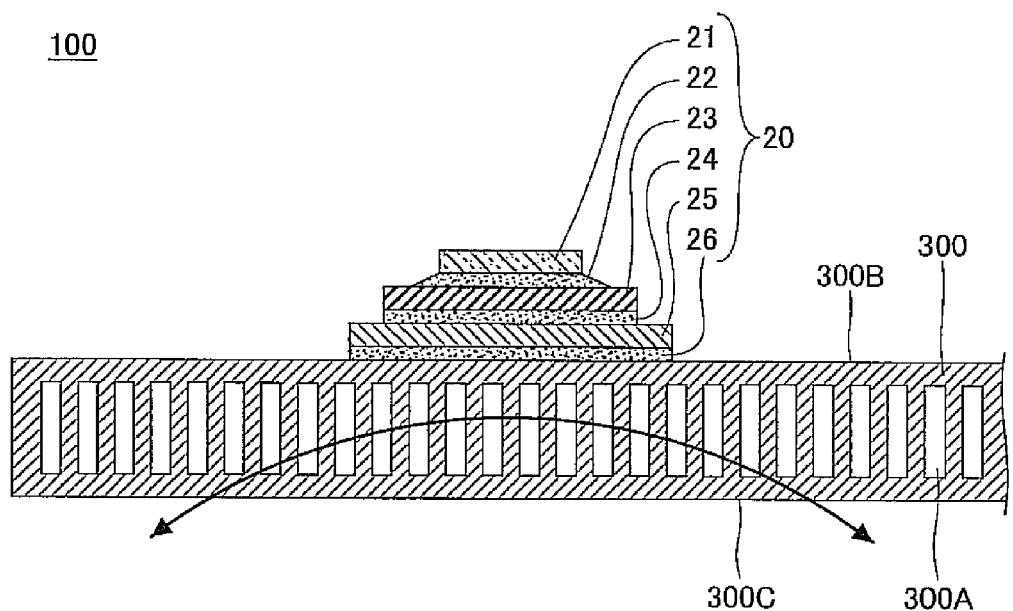
FIG. 2A shows an exemplary relationship between a shape of a radiator and stress.

In the following, preferred embodiments of the present invention are described with reference to the drawings.

<Embodiment 1>

FIG. 1 shows an exemplary cross-sectional view of the semiconductor apparatus 10 according to embodiment 1 of the present invention. As shown in FIG. 1, the semiconductor apparatus 10 includes plural semiconductor modules 20 and a radiator 30. The semiconductor module 20 includes a semiconductor element 21, a first bonding material 22, an insulated substrate 23, second bonding material 24, a radiator plate 25 and third bonding material 26.

The radiator 30 includes plural flow paths 30A for a cooling medium. Reference numeral 30B indicates a first main surface of the radiator 30. Reference numerals 30B1 and 30B2 indicate semiconductor module mount-surfaces which are located in the first main surface 30B and on which the semiconductor modules 20 are to be mounted. Reference numeral 30C indicates a second main surface which is located on the opposite side of the first main surface 30B of the semiconductor apparatus 10. Reference numerals 30C1 and 30C2 indicate semiconductor module mount-surfaces which are located in the second main surface 30C and on which the semiconductor modules 20 are to be mounted.

As shown in FIG. 1, the semiconductor apparatus 10 includes the radiator 30 on which plural of the semiconductor modules 20 that include the semiconductor elements 21 are mounted. The radiator 30 includes the first main surface 30B and the second main surface 30C which is located on the opposite side of the first main surface 30B. The semiconductor module mount-surfaces 30B1 and 30B2, on which the semiconductor modules 20 are mounted, are located on the first main surface 30B of the radiator 30 in a zigzag pattern in cross-sectional view.

The semiconductor module mount-surfaces 30C1 and 30C2, on which the semiconductor modules 20 are mounted, are located on the second main surface 30C of the radiator 30 in a zigzag pattern in cross-sectional view. Herein, the semiconductor module mount-surfaces 30B1, 30B2, 30C1 and 30C2 are arranged to have the semiconductor modules 20 mounted thereon. It is not necessary to mount the semiconductor modules 20 onto all of the semiconductor module mount-surface 30B1, 30B2, 30C1 and 30C2.

The semiconductor module mount-surface 30B1 is located on a bottom surface of a concave portion of the first main surface 30B in cross-sectional view.

The semiconductor module mount-surface 30B2 is located on a top surface of a convex portion of the first main surface 30B in cross-sectional view. The semiconductor module mount-surface 30C1 is located on a bottom surface of a concave portion of the second main surface 30C in cross-sectional view. The semiconductor module mount-surface 30C2 is located on a top surface of a convex portion of the second main surface 30C in cross-sectional view.

Herein, the semiconductor module mount-surfaces 30B1 and 30B2 are formed periodically, and the semiconductor module mount-surfaces 30C1 and 30C2 are formed periodically. According to the semiconductor apparatus 10 of the first embodiment of the present invention, the semiconductor modules 20 are mounted only on the semiconductor module mount-surface 30B1 among the semiconductor module mount-surfaces 30B1, 30B2, 30C1 and 30C2.

The semiconductor element 21 included in the semiconductor module 20 is constituted of a semiconductor element which is made of silicon, SiC or the like. The semiconductor element 21 is constituted of, for example, an IGBT (Insulated Gate Bipolar Transistor), a BT (Bipolar Transistor), an FET (Field Effect Transistor) or the like. But the semiconductor element 21 is not limited to these transistors.

The first bonding material 22 included in the semiconductor module 20 has a function of bonding the semiconductor element 21 and the insulated substrate 23. As the first bonding material 22, for example, solder or braze can be used. The insulated substrate 23 included in the semiconductor module 20 is constituted of a plate-like member formed of an insulated material. The insulated substrate 23 insulates the semiconductor element 21 which is bonded onto the insulated substrate 23 by the first bonding material 22 and the radiator 25. The insulated substrate 23 has a function of conducting heat which is generated in the semiconductor element 21 to the radiator 25. As a material of the insulated substrate 23, for example, a ceramic such as AlN, a resin material such as paper phenol, glass epoxy or the like can be used.

A printed wire which is not shown and is formed of conductive material such as Cu, Al or the like is formed on the top surface and/or the bottom surface of the insulated substrate 23. The printed wire has a function of electrically connecting the semiconductor element 21, which is bonded on the insulated substrate 23 by the first bonding material 22, and other electronic components, and electrically connecting the semiconductor element 21 and an external circuit of the semiconductor apparatus 10.

The second bonding material 24 included in the semiconductor module 20 has a function of bonding the insulated substrate 23 and the radiator 25. As the second bonding material 24, for example, solder or braze can be used. The radiator plate 25 included in the semiconductor module 20 is constituted of, for example, a plate-like member which is made of metallic material or the like. The radiator plate 25 has a function of conducting heat, which is generated by the semiconductor element 21 and is conducted from the semiconductor element 21 to the radiator plate 25 via the insulated plate 23, to the radiator 30. As a material of the radiator plate 25, a metallic material, which has high heat conductivity, such as Al, Cu, Mo or alloys of these metals, for example, can be used. The third bonding material 26 has a function of bonding the radiator plate 25 and the radiator 30. As the third bonding material 26, for example, solder or braze can be used.

The radiator 30 has a function of radiating heat, which is generated by the semiconductor element 21 and is conducted from the semiconductor element 21 to the radiator 30 via the insulated plate 23 and the radiator plate 25, away from the semiconductor apparatus 10.

A cross-sectional shape of the radiator 30 is almost symmetrical about a point. As described above, the semiconductor module mount-surface 30B1, 30B2, 30C1 and 30C2 are arranged in a zigzag pattern in the first main surface 30B and the second main surface 30C of the radiator 30. The radiator 30 has a shape which includes slopes in boundaries between the concave portions, of the first main surfaces 30B and the second main surfaces 30C, and the convex portions located adjacent to the concave portions.

Figure 2B:
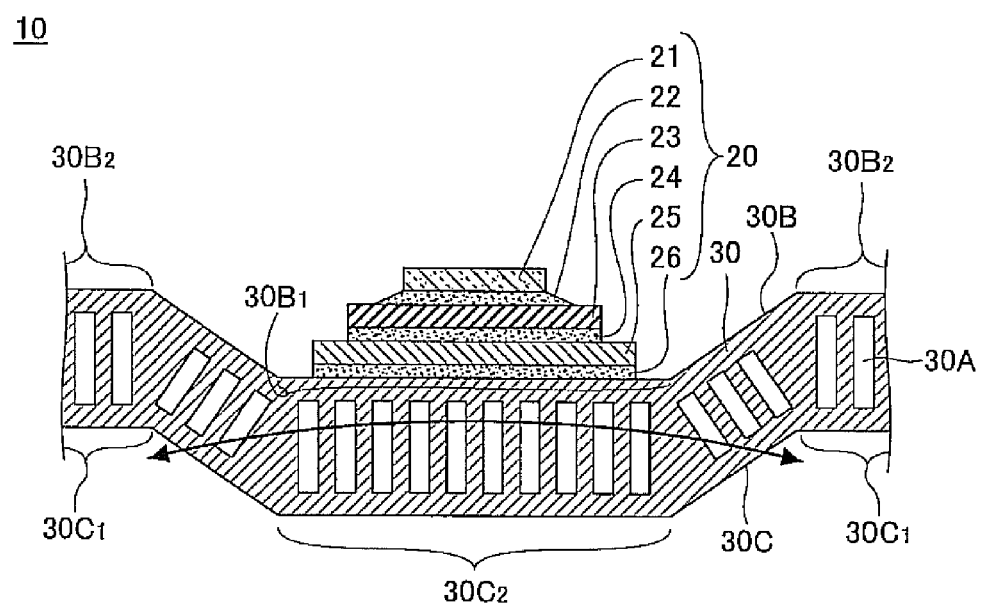
FIG. 2B shows an exemplary relationship between a shape of a radiator and stress.

FIGS. 2A and 2B show exemplary relationships between the shape of radiators and stresses. With regard to FIGS. 2A and 2B, the same elements as or similar elements to those of semiconductor apparatus as shown in FIG. 1 are referred to by the same reference numerals, and a description thereof may be omitted. FIG. 2A shows a part of a conventional semiconductor apparatus 100. FIG. 2B shows a part of the semiconductor apparatus 10 according to the first embodiment.

As shown in FIG. 2A, reference numeral 300 indicates a radiator, reference numeral 300A indicates plural flow paths for a cooling medium arranged in the radiator 300, reference numeral 300B indicates a first main surface of the radiator 300, and reference numeral 300C indicates a second main surface of the radiator 300. The second main surface 300C is located on the opposite side of the first main surface 300B of the radiator 300. Although FIG. 2A shows only a part of the radiator 300, the radiator 300 does not include a concave portion and a convex portion on the first main surface 300B and the second main surface 300C such as the concave portion and the convex portion of the radiator 30.

Arrows as shown in FIGS. 2A and 2B indicate stress of the radiators 30 and 300. The larger the curvature factor of the arrow becomes, the larger is the stress of the radiator 30 or 300.

Herein, the reason why the stress which may cause warping in the radiators 30 and 300 occurs will be described. The semiconductor apparatus 10 and the conventional semiconductor apparatus 100 are manufactured in an atmosphere where temperature is kept at, for example, around 230° C. for the reason, for example, of melting the solders. The semiconductor element 21, the first bonding material 22, the insulated substrate 23, the second bonding material 24, the radiator plate 25, the third bonding material 26 and the radiator 30 (or the radiator 300) are bonded in the atmosphere where the temperature is kept at, for example, around 230° C., and then the semiconductor apparatus 10 (or 100) becomes completed. During the bonding process, the semiconductor element 21, the first bonding material 22, the insulated substrate 23, the second bonding material 24, the radiator plate 25, the third bonding material 26 and the radiator 30 (or the radiator 300) are not warped.

After the temperature of the semiconductor apparatus 10 or 100 drops down to normal temperature, stresses in the direction of contraction are caused by the temperature difference between the temperature at the bonding process and normal temperature. Herein, in general, the radiator 30 (or 300) has a much larger linear expansion coefficient than that of the semiconductor module 20. The linear expansion coefficient of the radiator 30 (or 300) is twice or thrice larger than that of the semiconductor module 20, even though the linear expansion coefficient of the radiator 30 (or 300) depends on composition of the material or the like of the radiator 30 (or 300).

The difference of the linear expansion coefficients causes the semiconductor module 20, which has smaller linear expansion coefficient, to shrink little, but causes the radiator 30 (or 300) to shrink largely. Since the semiconductor module 20 is bonded to the radiator 30 by the semiconductor module mount-surface 30B1 of the first main surface 30B, the semiconductor module 20, which has smaller linear expansion coefficient, suppresses the warping of the radiator 30. Since the semiconductor module 20 is bonded to the radiator 300 by the first main surface 300B, the semiconductor module 20, which has smaller linear expansion coefficient, suppresses the warping of the radiator 300.

Therefore, a closer part of the radiator 30 to the semiconductor module mount-surface 30B1 shrinks little, and a closer part of the radiator 300 to the first main surface 30C2 shrinks little. On the contrary, since a closer part of the radiator 30 to the semiconductor module mount-surface 30C2 of the second main surface 30C is not affected by the semiconductor module 20, the closer part of the radiator 30 to the semiconductor module mount-surface 30C2 of the second main surface 30C shrinks largely. Since a closer part of the radiator 300 to the second main surface 300C is not affected by the semiconductor module 20, the closer part of the radiator 300 to the second main surface 300C shrinks largely. Thus, the radiators 30 and 300 warp convexly.

Herein, the stress which causes the radiator 30 to warp convexly depends on the volume of a space which is sandwiched by the semiconductor module mount-surface 30B1 of the first main surface 30B and the semiconductor module mount-surface 30C2 of the second main surface 30C. The smaller the volume becomes, the weaker the stress which causes the radiator 30 to warp convexly becomes. The stress which causes the radiator 300 to warp convexly depends on the volume of a space which is sandwiched by the first main surface 300B and the second main surface 300C. The smaller the volume becomes, the weaker the stress which causes the radiator 300 to warp convexly becomes.

As is evident in FIGS. 2A and 2B, the volume of the space, which is sandwiched by the semiconductor module mount-surface 30B1 of the first main surface 30B and the semiconductor module mount-surface 30C2 of the second main surface 30C, is smaller than the volume of the space which is sandwiched by the first main surface 300E and the second main surface 300C. Thus, the stress which causes the radiator 30 to warp is weaker than the stress which causes the radiator 300 to warp.

As a result, according to the configuration as shown in FIG. 2B, the semiconductor element 21, the first bonding material 22, the insulated substrate 23, the second bonding material 24, the radiator plate 25 and the third bonding material 26 are subjected to less stress than the configuration as shown in FIG. 2A. Thus, according to the configuration as shown in FIG. 2B, the semiconductor element 21, the first bonding material 22, the insulated substrate 23, the second bonding material 24, the radiator plate 25 and the third bonding material 26 may not easily be cracked.

Herein, a grease, which has flexibility, may be used as the first bonding material 22, the second bonding material 24 or the third bonding material 26 instead of the solder or the braze which does not have flexibility. Since the grease has flexibility, the grease can absorb the stress which is caused by the radiator 30 or the radiator 300 that warps convexly, and is applied to the semiconductor element 21, the insulated substrate 23 and the radiator plate 25. However, the grease has lower heat conductivity than the solder and the braze, and produces more heat. Thus, from the point of view of heat radiation, it is more favorable to use a material, which has high heat conductivity, such as the solder or the braze or the like as the first bonding material 22, the second bonding material 24 and the third bonding material 26 than to use the grease.

According to the configuration of the radiator 30 of the present invention, as described above, it becomes possible to reduce the stress which is caused by heat and which causes the radiator 30 to warp convexly, compared to the conventional radiator 300. Thus the stress which acts on the semiconductor elements 21, the first bonding material 22, the insulated substrate 23, the second bonding material 24, the radiator plate 25 and the third bonding material 26 is reduced. It becomes possible to suppress generation of cracks in the semiconductor elements 21, the first bonding material 22, the insulated substrate 23, the second bonding material 24, the radiator plates 25 and the third bonding material 26, even when the solder or the braze, which does not have flexibility, is used as the bonding material.

Figure 3A:
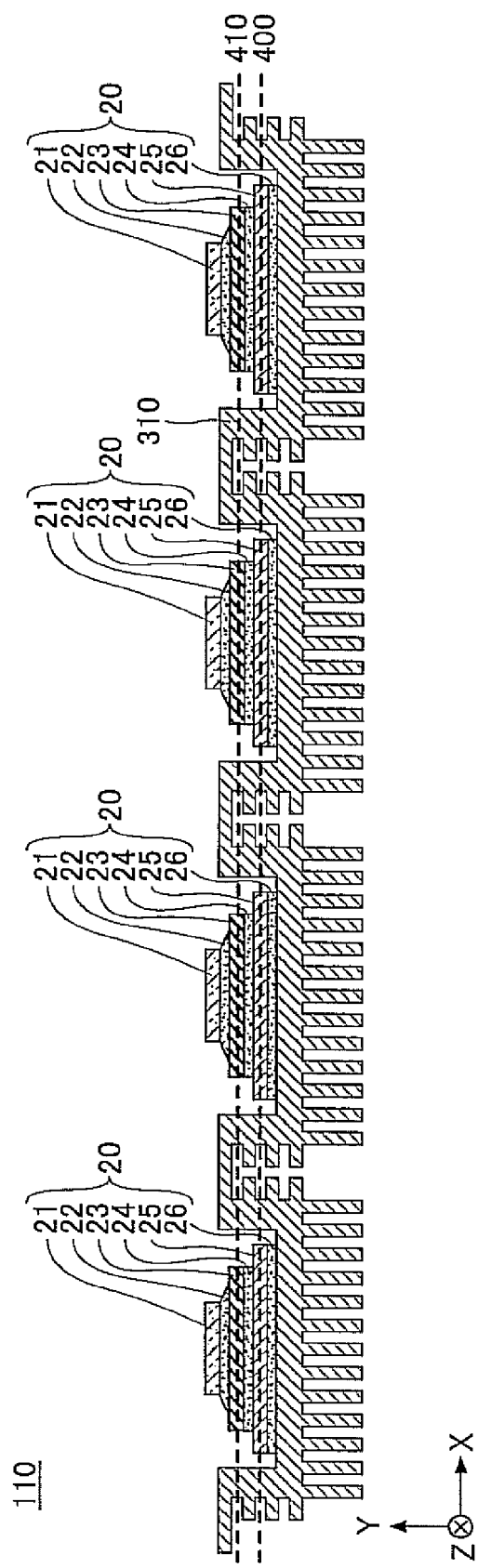
FIG. 3A shows a cross-sectional view in which exemplary levels of stress-neutral planes are shown.

FIGS. 3A and 3B show cross-sectional views in which exemplary levels of stress-neutral planes are shown. With regard to FIGS. 3A and 3B, the same elements as or similar elements to those of semiconductor apparatus as shown in FIG. 1 are referred to by the same reference numerals, and a description thereof may be omitted. FIG. 3A shows a cross-sectional view in which levels of stress-neutral planes of the conventional semiconductor apparatus 110 are shown. FIG. 3B shows a cross-sectional view in which levels of stress-neutral planes of the semiconductor apparatus 10 according to embodiment 1 are shown.

As shown in FIG. 3A, reference numeral 310 indicates a radiator 310, reference numeral 400 indicates a stress-neutral plane the radiator 310 in a case where the semiconductor modules 20 are not mounted onto the radiator 310, i.e. the radiator 310 by itself. Reference numeral 410 indicates a stress-neutral plane of the semiconductor apparatus 110. Herein, the semiconductor apparatus 110 includes the radiator 310 and plural of the semiconductor modules 20 which are mounted on the radiator 310. As shown in FIG. 3B, reference numeral 40 indicates a stress-neutral plane of the radiator 30 in a case where the semiconductor modules 20 are not mounted onto the radiator 30, i.e. the radiator 30 by itself. Reference numeral 41 indicates a stress-neutral plane of the semiconductor apparatus 10. Herein, the semiconductor apparatus 10 includes the radiator 30 and plural of the semiconductor modules 20 which are mounted onto the radiator 30.

Herein, the stress-neutral plane is a plane which becomes a boundary of tensile stress and compressive stress. The stress becomes zero (no tension and no compression) or a lower value (lower tension or lower compression). In general, in a designated structure, an amount of warping on the upper side of the stress-neutral plane and an amount of warping on the lower side of the stress-neutral plane are almost the same, and the directions thereof are opposite in a case where the stress-neutral plane is located adjacent to the center of the designated structure. Thus the warping on the upper side of the stress-neutral plane and the warping on the lower side of the stress-neutral plane are balanced, and the amount of warping is reduced largely compared to a designated structure in which the stress-neutral plane is located away from the center of the designated structure. Although the stress-neutral planes 40, 41, 400 and 410 are shown as parallel line segments in FIGS. 3A and 3B, the stress-neutral planes 40, 41, 400 and 410 have planes which extend in the direction of Z axis, respectively.

Since the radiator 310 included in the conventional semiconductor apparatus 110 has a shape which is not symmetrical about a point, the stress-neutral plane 400 of the radiator 310 by itself is located on the upper side (positive side in the direction of Y axis) with regard to the central portion of the radiator 310 in the direction of thickness of the radiator 310 (in the direction parallel to Y axis). In a case where plural of the semiconductor modules 20 are mounted onto the radiator 310, i.e. finished semiconductor apparatus 110, the stress-neutral plane 400 shifts further to the upper side (positive side in the direction of Y axis) and becomes the stress-neutral plane 410. The stress-neutral plane 410 is located far away from the central portion of the radiator 310 in the direction of thickness of the radiator 310 (in the direction parallel to Y axis).

On the contrary, since the radiator 30 included in the semiconductor apparatus 10 according to embodiment 1 of the present invention has a shape which is almost symmetrical about a point, the stress-neutral plane 40 of the radiator 30 by itself is located near the central portion of the radiator 30 in the direction of thickness of the radiator 30 (in the direction parallel to Y axis). Thus the volume of the radiator 30 of the one side (for example, positive side in the direction of Y axis) of the stress-neutral plane 40 is almost equal to the volume of the radiator 30 of the other side (for example, negative side in the direction of Y axis) of the stress-neutral plane 40. In a case where plural of the semiconductor modules 20 are mounted onto the radiator 30, i.e. finished semiconductor apparatus 10, the stress-neutral plane 40 shifts to upper side (positive side in the direction of Y axis) and becomes the stress-neutral plane 41.

Herein, the stress-neutral plane 40 of the radiator 30 by itself is located near the central portion of the radiator 30 in the direction of thickness of the radiator 30 (in the direction parallel to Y axis), and the volume of the radiator 30 is much larger than the volume of the semiconductor modules 20. Thus, the stress-neutral plane 41, which indicates a neutral plane in which the semiconductor modules 20 are mounted onto the radiator 30, is located adjacent to the central portion of the radiator 30 in the direction of thickness of the radiator 30 (in the direction parallel to Y axis).

As described above, the stress-neutral plane 41 of the semiconductor apparatus 10 according to embodiment 1 of the present invention is located closer to the central portion of the radiator 30 in the direction of thickness of the radiator 30 (in the direction parallel to Y axis) than the stress-neutral plane 410 of the semiconductor apparatus 110. Thus the warping of the radiator 30 included in the semiconductor apparatus 10 can be reduced. Herein, it is important to locate the stress-neutral plane 41 near the central portion of the radiator 30 in the direction of thickness of the radiator 30 (in the direction parallel to Y axis), and it is not always necessary to form the radiator in the shape which is almost symmetrical about a point.

According to the semiconductor apparatus 10 of embodiment 1 of the present invention, as described above, the semiconductor module mount-surfaces 30B1 and 30B2 are located in the first main surface 30B in a zigzag pattern in cross-sectional view, and the semiconductor module mount-surfaces 30C1 and 30C2 are located in the second main surface 30C in a zigzag pattern in cross-sectional view. Further, plural of the semiconductor modules 20 are mounted onto the semiconductor module mount-surface 30B1. Thus the volume of lower portion of the radiator 30 than the semiconductor module mount-surfaces 30B1 becomes smaller than that of the radiator 310, and it becomes possible to reduce the stress which causes the warping of the radiator 30 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress the generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 10 of embodiment 1 of the present invention, the stress-neutral plane of the semiconductor apparatus 10 is located adjacent to the central portion of the radiator 30 in the direction of thickness of the radiator 30 (in the direction parallel to Y axis). Thus the warping of the radiator 30 included in the semiconductor apparatus 10 can be reduced, and it becomes possible to reduce the stress which causes the warping of the radiator 30 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

<First Variation of Embodiment 1>

FIG. 4 shows an exemplary cross-sectional view of the semiconductor apparatus 11 according to a first variation of embodiment 1 of the present invention. With regard to FIG. 4, the same elements as or similar elements to those of semiconductor apparatus as shown in FIG. 1 are referred to by the same reference numerals, and a description thereof may be omitted. Hereinafter, differences between the semiconductor apparatus 11 according to the first variation of embodiment 1 of the present invention and the semiconductor apparatus 10 according to embodiment 1 will be described.

As shown in FIG. 4, the semiconductor apparatus 11 includes plural of the semiconductor modules 20 and a radiator 31. The radiator 31 includes plural flow paths 31A of the cooling medium. Reference numeral 31B indicates a first main surface of the radiator 31, and reference numerals 31B1 and 31B2 indicate semiconductor module mount-surfaces which are located in the first main surface 31B. Reference numeral 31C indicates a second main surface of the radiator 31 which is located on the opposite side of the first main surface 31B. Reference numerals 31C1 and 31C2 indicate semiconductor module mount-surfaces which are located in the second main surface 31C.

As shown in FIG. 4, the semiconductor apparatus 11 includes the radiator 31 on which plural of the semiconductor modules 20 that include the semiconductor elements 21 are mounted. The radiator 31 includes the first main surface 31B and the second main surface 31C which is located on the opposite side of the first main surface 31B. The semiconductor module mount-surfaces 31B1 and 31B2, on which the semiconductor modules 20 are mounted, are located in the first main surface 31B of the radiator 31 in a zigzag pattern in cross-sectional view. The semiconductor module mount-surfaces 31C1 and 31C2, on which the semiconductor modules 20 are mounted, are located in the second main surface 31C of the radiator 31 in a zigzag pattern in cross-sectional view.

The semiconductor module mount-surface 31B1 is located on a bottom surface of a concave portion of the first main surface 31B in cross-sectional view. The semiconductor module mount-surface 31B2 is located on a top surface of a convex portion of the first main surface 316 in cross-sectional view. The semiconductor module mount-surface 31C1 is located on a bottom surface of a concave portion of the second main surface 31C in cross-sectional view. The semiconductor module mount-surface 31C2 is located on a top surface of a convex portion of the second main surface 31C in cross-sectional view. Herein, the semiconductor module mount-surfaces 31B1 and 31B2 are formed periodically, and the semiconductor module mount-surfaces 31C1 and 31C2 are formed periodically. The semiconductor modules 20 are mounted on the semiconductor module mount-surfaces 31B1.

The difference between the semiconductor apparatus 11 as shown in FIG. 4 and the semiconductor apparatus 10 as shown in FIG. 1 is only the shape of the radiator 31. In more detail, the radiator 31 of the semiconductor apparatus 11 includes vertical surfaces in boundaries between the concave portions, of the first main surfaces 31B and the second main surfaces 31C, and the convex portions located adjacent to the concave portions instead of the slopes of the radiator 30 of the semiconductor apparatus 10 as shown in FIG. 1.

The boundaries have the vertical surfaces as shown in FIG. 4. The volume of the space, which is sandwiched by the semiconductor module mount-surface 31B1 of the first main surface 31B and the semiconductor module mount-surface 31C2 of the second main surface 31C, is smaller than the volume of the space which is sandwiched by the first main surface 300B and the second main surface 300C of the conventional semiconductor apparatus 100 as shown in FIG. 2A. Thus, the stress which causes the radiator 31 to warp is weaker than the stress which causes the radiator 300 to warp.

The boundaries have the vertical surfaces as shown in FIG. 4. A stress-neutral plane of the radiator 31 by itself is located near the central portion of the radiator 31 in the direction of thickness of the radiator 31 (in the direction parallel to Y axis), and the volume of the radiator 31 is much larger than the volume of the semiconductor modules 20. As a result, a shift amount of a stress-neutral plane is relatively small even when the semiconductor modules 20 are mounted onto the radiator 31. Thus, a stress-neutral plane of the radiator 31 on which the semiconductor modules 20 are mounted is located adjacent to the central portion of the radiator 31 in the direction of thickness of the radiator 31 (in the direction parallel to Y axis). Thus, the semiconductor apparatus 11 according to the first variation of embodiment 1 of the present invention has a similar effect to that of the semiconductor apparatus 10 according to embodiment 1 of the present invention.

According to the semiconductor apparatus 11 of the first variation of embodiment 1 of the present invention, as described above, the semiconductor module mount-surfaces 31B1 and 31B2 are located in the first main surface 31B in a zigzag pattern in cross-sectional view, and the semiconductor module mount-surfaces 31C1 and 31C2 are located in the second main surface 31C in a zigzag pattern in cross-sectional view. Further, plural of the semiconductor modules 20 are mounted onto the semiconductor module mount-surface 31B1. Thus the volume of a portion of the radiator 31 lower than the semiconductor module mount-surfaces 31B1 becomes smaller than that of the radiator 310, and it becomes possible to reduce the stress which causes the warping of the radiator 31 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 11 of the first variation of embodiment 1 of the present invention, the stress-neutral plane of the semiconductor apparatus 11 is located adjacent to the central portion of the radiator 31 in the direction of thickness of the radiator 31 (in the direction parallel to Y axis). Thus the warping of the radiator 31 included in the semiconductor apparatus 11 can be reduced, and it becomes possible to reduce the stress which causes the warping of the radiator 31 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

<Second Variation of Embodiment 1>

FIG. 5 shows an exemplary cross-sectional view of the semiconductor apparatus 12 according to a second variation of embodiment 1 of the present invention. With regard to FIG. 5, the same elements as or similar elements to those of semiconductor apparatus as shown in FIG. 1 are referred to by the same reference numerals, and a description thereof may be omitted. Hereinafter, differences between the semiconductor apparatus 12 according to the second variation of embodiment 1 of the present invention and the semiconductor apparatus 10 according to embodiment 1 will be described.

As shown in FIG. 5, the semiconductor apparatus 12 includes plural of the semiconductor modules 20 and a radiator 32. The radiator 32 includes plural flow paths 32A of the cooling medium. Reference numeral 32B indicates a first main surface of the radiator 32, and reference numerals 32B1 and 32B2 indicate semiconductor module mount-surfaces which are located in the first main surface 32B. Reference numeral 32C indicates a second main surface of the radiator 32 which is located on the opposite side of the first main surface 32B. Reference numerals 32C1 and 32C2 indicate semiconductor module mount-surfaces which are located in the second main surface 32C.

As shown in FIG. 5, the semiconductor apparatus 12 includes the radiator 32 on which plural of the semiconductor modules 20 that include the semiconductor elements 21 are mounted. The radiator 32 includes the first main surface 32B and the second main surface 32C which is located on the opposite side of the first main surface 32B. The semiconductor module mount-surfaces 32B1 and 32B2, on which the semiconductor modules 20 are mounted, are located in the first main surface 32B of the radiator 32 in a zigzag pattern in cross-sectional view. The semiconductor module mount-surfaces 32C1 and 32C2, on which the semiconductor modules 20 are mounted, are located in the second main surface 32C of the radiator 32 in a zigzag pattern in cross-sectional view.

The semiconductor module mount-surface 32B1 is located on a bottom surface of a concave portion of the first main surface 32B in cross-sectional view. The semiconductor module mount-surface 32B2 is located on a top surface of a convex portion of the first main surface 32B in cross-sectional view. The semiconductor module mount-surface 32C1 is located on a bottom surface of a concave portion of the second main surface 32C in cross-sectional view. The semiconductor module mount-surface 32C2 is located on a top surface of a convex portion of the second main surface 32C in cross-sectional view. Herein, the semiconductor module mount-surfaces 32B1 and 32B2 are formed periodically, and the semiconductor module mount-surfaces 32C1 and 32C2 are formed periodically. The semiconductor modules 20 are mounted on the semiconductor module mount-surfaces 32B1.

The difference between the semiconductor apparatus 12 as shown in FIG. 5 and the semiconductor apparatus 10 as shown in FIG. 1 is only the shape of the radiator 32. In more detail, the radiator 32 of the semiconductor apparatus 12 includes vertical surfaces in boundaries between the concave portions, of the first main surfaces 32B and the second main surfaces 32C, and the convex portions located adjacent to the concave portions instead of the slopes of the radiator 30 of the semiconductor apparatus 10 as shown in FIG. 1. Further, the radiator 32 includes round portions on corners of the boundaries.

The boundaries have the vertical surfaces as shown in FIG. 5, and the radiator 32 further includes the round portions on the corners of the boundaries. The volume of the space, which is sandwiched by the semiconductor module mount-surface 32B1 of the first main surface 32B and the semiconductor module mount-surface 32C2 of the second main surface 32C, is smaller than the volume of the space which is sandwiched by the first main surface 300B and the second main surface 300C of the conventional semiconductor apparatus 100 as shown in FIG. 2A. Thus, the stress which causes the radiator 32 to warp is weaker than the stress which causes the radiator 300 to warp.

The boundaries have the vertical surfaces as shown in FIG. 5, and the radiator 32 further includes the round portions on the corners of the boundaries. A stress-neutral plane of the radiator 32 by itself is located near the central portion of the radiator 32 in the direction of thickness of the radiator 32 (in the direction parallel to Y axis), and the volume of the radiator 32 is much larger than the volume of the semiconductor modules 20. As a result, a shift amount of a stress-neutral plane is relatively small even when the semiconductor modules 20 are mounted onto the radiator 32. Thus, a stress-neutral plane of the radiator 32 on which the semiconductor modules 20 are mounted is located adjacent to the central portion of the radiator 32 in the direction of thickness of the radiator 32 (in the direction parallel to Y axis). Thus, the semiconductor apparatus 12 according to the second variation of embodiment 1 of the present invention has a similar effect to that of the semiconductor apparatus 10 according to embodiment 1 of the present invention.

According to the semiconductor apparatus 11 of the second variation of embodiment 1 of the present invention, as described above, the semiconductor module mount-surfaces 32B1 and 32B2 are located in the first main surface 32B in a zigzag pattern in cross-sectional view, and the semiconductor module mount-surfaces 32C1 and 32C2 are located in the second main surface 32C in a zigzag pattern in cross-sectional view. Further, plural of the semiconductor modules 20 are mounted onto the semiconductor module mount-surface 32B1. Thus the volume of a portion of the radiator 31 lower than the semiconductor module mount-surfaces 32B1 becomes smaller than that of the radiator 310, and it becomes possible to reduce the stress which causes the warping of the radiator 32 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 12 of the second variation of embodiment 1 of the present invention, the stress-neutral plane of the semiconductor apparatus 12 is located adjacent to the central portion of the radiator 32 in the direction of thickness of the radiator 32 (in the direction parallel to Y axis). Thus the warping of the radiator 32 included in the semiconductor apparatus 12 can be reduced, and it becomes possible to reduce the stress which causes the warping of the radiator 32 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

<Third Variation of Embodiment 1>

Figure 6:
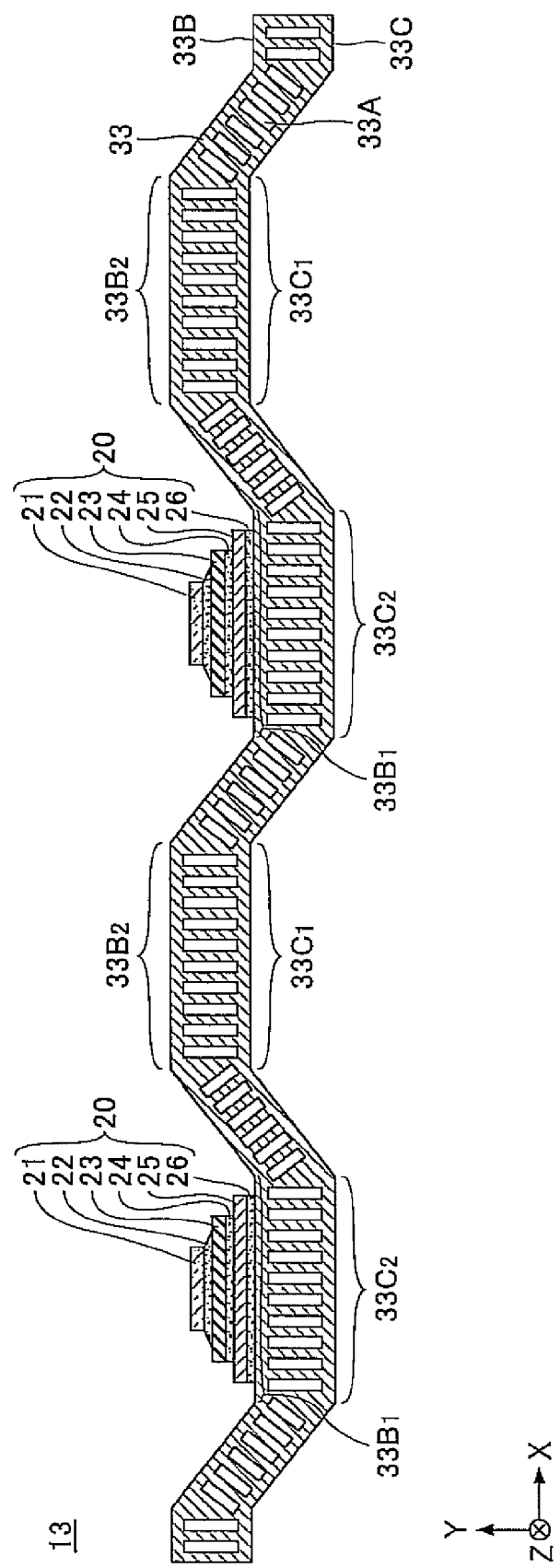
FIG. 6 shows an exemplary cross-sectional view of a semiconductor apparatus 13 according to a third variation of embodiment 1 of the present invention.

FIG. 6 shows an exemplary cross-sectional view of the semiconductor apparatus 13 according to a third variation of embodiment 1 of the present invention. With regard to FIG. 6, the same elements as or similar elements to those of semiconductor apparatus as shown in FIG. 1 are referred to by the same reference numerals, and a description thereof may be omitted. Hereinafter, differences between the semiconductor apparatus 13 according to the third variation of embodiment 1 of the present invention and the semiconductor apparatus 10 according to embodiment 1 will be described.

As shown in FIG. 6, the semiconductor apparatus 13 includes plural of the semiconductor modules 20 and a radiator 33. The radiator 33 includes plural flow paths 33A of the cooling medium. Reference numeral 33B indicates a first main surface of the radiator 33, and reference numerals 33B1 and 33B2 indicate semiconductor module mount-surfaces which are located in the first main surface 33B. Reference numeral 33C indicates a second main surface of the radiator 33 which is located on the opposite side of the first main surface 33B. Reference numerals 33C1 and 33C2 indicate semiconductor module mount-surfaces which are located in the second main surface 33C.

As shown in FIG. 6, the semiconductor apparatus 13 includes the radiator 33 on which plural of the semiconductor modules 20 that include the semiconductor elements 21 are mounted. The radiator 33 includes the first main surface 33B and the second main surface 33C which is located on the opposite side of the first main surface 33B. The semiconductor module mount-surfaces 33B1 and 33B2, on which the semiconductor modules 20 are mounted, are located in the first main surface 33B of the radiator 33 in a zigzag pattern in cross-sectional view. The semiconductor module mount-surfaces 33C1 and 33C2, on which the semiconductor modules 20 are mounted, are located in the second main surface 33C of the radiator 33 in a zigzag pattern in cross-sectional view.

The semiconductor module mount-surface 33B1 is located on a bottom surface of a concave portion of the first main surface 33B in cross-sectional view. The semiconductor module mount-surface 33B2 is located on a top surface of a convex portion of the first main surface 33B in cross-sectional view. The semiconductor module mount-surface 33C1 is located on a bottom surface of a concave portion of the second main surface 33C in cross-sectional view. The semiconductor module mount-surface 3302 is located on a top surface of a convex portion of the second main surface 330 in cross-sectional view. Herein, the semiconductor module mount-surfaces 33B1 and 33B2 are formed periodically, and the semiconductor module mount-surfaces 33C1 and 33C2 are formed periodically. The semiconductor modules 20 are mounted on the semiconductor module mount-surfaces 33B1.

The difference between the semiconductor apparatus 13 as shown in FIG. 6 and the semiconductor apparatus 10 as shown in FIG. 1 is only the shape of the radiator 33. In more detail, the radiator 33 of the semiconductor apparatus 13 includes slopes in boundaries between the concave portions, of the first main surfaces 33B and the second main surfaces 33C, and the convex portions located adjacent to the concave portions. Although the slopes of the radiator 33 are similar to the slopes of the radiator 30 of the semiconductor apparatus 10 as shown in FIG. 1, the semiconductor module mount-surfaces 33B2 are located above the top surfaces of the semiconductor elements 21.

The boundaries have the slopes as shown in FIG. 6, and the semiconductor module mount-surfaces 33B2 are located above the top surfaces of the semiconductor elements 21. The volume of the space, which is sandwiched by the semiconductor module mount-surface 33B1 of the first main surface 33B and the semiconductor module mount-surface 33C2 of the second main surface 33C, is smaller than the volume of the space which is sandwiched by the first main surface 300B and the second main surface 300C of the conventional semiconductor apparatus 100 as shown in FIG. 2A. Thus, the stress which causes the radiator 33 to warp is weaker than the stress which causes the radiator 300 to warp.

The boundaries have the slopes as shown in FIG. 6, and the semiconductor module mount-surfaces 33B2 are located above the top surfaces of the semiconductor elements 21. A stress-neutral plane of the radiator 33 by itself is located near the central portion of the radiator 33 in the direction of thickness of the radiator 33 (in the direction parallel to Y axis), and the volume of the radiator 33 is much larger than the volume of the semiconductor modules 20. As a result, a shift amount of a stress-neutral plane is relatively small even when the semiconductor modules 20 are mounted onto the radiator 33. Thus, a stress-neutral plane of the radiator 33 on which the semiconductor modules 20 are mounted is located adjacent to the central portion of the radiator 33 in the direction of thickness of the radiator 33 (in the direction parallel to Y axis). Thus, the semiconductor apparatus 13 according to the third variation of embodiment 1 of the present invention has a similar effect to that of the semiconductor apparatus 10 according to embodiment 1 of the present invention.

According to the semiconductor apparatus 13 of the third variation of embodiment 1 of the present invention, as described above, the semiconductor module mount-surfaces 33B1 and 33B2 are located in the first main surface 33B in a zigzag pattern in cross-sectional view, and the semiconductor module mount-surfaces 33C1 and 33C2 are located in the second main surface 33C in a zigzag pattern in cross-sectional view. Further, plural of the semiconductor modules 20 are mounted onto the semiconductor module mount-surface 33B1. Thus the volume of a portion of the radiator 33 lower than the semiconductor module mount-surfaces 33B1 becomes smaller than that of the radiator 310, and it becomes possible to reduce the stress which causes the warping of the radiator 33 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 13 of the third variation of embodiment 1 of the present invention, the stress-neutral plane of the semiconductor apparatus 13 is located adjacent to the central portion of the radiator 33 in the direction of thickness of the radiator 33 (in the direction parallel to Y axis). Thus the warping of the radiator 33 included in the semiconductor apparatus 13 can be reduced, and it becomes possible to reduce the stress which causes the warping of the radiator 33 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

<Fourth Variation of Embodiment 1>

Figure 7:
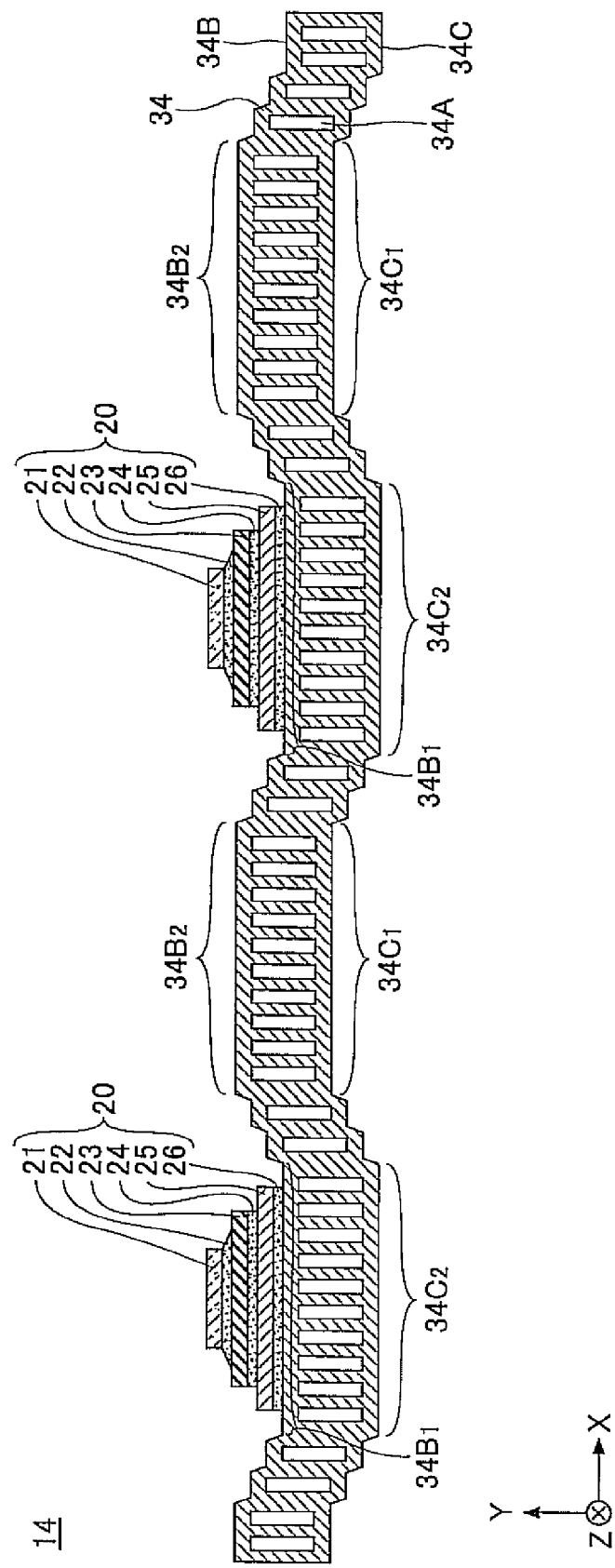
FIG. 7 shows an exemplary cross-sectional view of a semiconductor apparatus 14 according to a fourth variation of embodiment 1 of the present invention.

FIG. 7 shows an exemplary cross-sectional view of the semiconductor apparatus 14 according to a fourth variation of embodiment 1 of the present invention. With regard to FIG. 7, the same elements as or similar elements to those of semiconductor apparatus as shown in FIG. 1 are referred to by the same reference numerals, and a description thereof may be omitted. Hereinafter, differences between the semiconductor apparatus 14 according to the fourth variation of embodiment 1 of the present invention and the semiconductor apparatus 10 according to embodiment 1 will be described.

As shown in FIG. 7, the semiconductor apparatus 14 includes plural of the semiconductor modules 20 and a radiator 34. The radiator 34 includes plural flow paths 34A of the cooling medium. Reference numeral 346 indicates a first main surface of the radiator 34, and reference numerals 34B1 and 34B2 indicate semiconductor module mount-surfaces which are located in the first main surface 34B. Reference numeral 34C indicates a second main surface of the radiator 34 which is located on the opposite side of the first main surface 34B. Reference numerals 34C1 and 34C2 indicate semiconductor module mount-surfaces which are located in the second main surface 34C.

As shown in FIG. 7, the semiconductor apparatus 14 includes the radiator 34 on which plural of the semiconductor modules 20 that include the semiconductor elements 21 are mounted. The radiator 34 includes the first main surface 34B and the second main surface 34C which is located on the opposite side of the first main surface 34B. The semiconductor module mount-surfaces 34B1 and 34B2, on which the semiconductor modules 20 are mounted, are located in the first main surface 346 of the radiator 34 in a zigzag pattern in cross-sectional view. The semiconductor module mount-surfaces 34C1 and 34C2, on which the semiconductor modules 20 are mounted, are located in the second main surface 34C of the radiator 34 in a zigzag pattern in cross-sectional view.

The semiconductor module mount-surface 34B1 is located on a bottom surface of a concave portion of the first main surface 34B in cross-sectional view. The semiconductor module mount-surface 34B2 is located on a top surface of a convex portion of the first main surface 34B in cross-sectional view. The semiconductor module mount-surface 34C1 is located on a bottom surface of a concave portion of the second main surface 34C in cross-sectional view. The semiconductor module mount-surface 34C2 is located on a top surface of a convex portion of the second main surface 34C in cross-sectional view. Herein, the semiconductor module mount-surfaces 34B1 and 34B2 are formed periodically, and the semiconductor module mount-surfaces 34C1 and 34C2 are formed periodically. The semiconductor modules 20 are mounted on the semiconductor module mount-surfaces 34B1.

The difference between the semiconductor apparatus 14 as shown in FIG. 7 and the semiconductor apparatus 10 as shown in FIG. 1 is only the shape of the radiator 34. In more detail, the radiator 34 of the semiconductor apparatus 14 includes steps in boundaries between the concave portions, of the first main surfaces 34B and the second main surfaces 34C, and the convex portions located adjacent to the concave portions instead of the slopes of the radiator 30 of the semiconductor apparatus 10 as shown in FIG. 1.

The boundaries have the steps as shown in FIG. 7. The volume of the space, which is sandwiched by the semiconductor module mount-surface 34B1 of the first main surface 34B and the semiconductor module mount-surface 34C2 of the second main surface 34C, is smaller than the volume of the space which is sandwiched by the first main surface 300B and the second main surface 300C of the conventional semiconductor apparatus 100 as shown in FIG. 2A. Thus, the stress which causes the radiator 34 to warp is weaker than the stress which causes the radiator 300 to warp.

The boundaries have the steps as shown in FIG. 7. A stress-neutral plane of the radiator 34 by itself is located near the central portion of the radiator 34 in the direction of thickness of the radiator 34 (in the direction parallel to Y axis), and the volume of the radiator 34 is much larger than the volume of the semiconductor modules 20. As a result, a shift amount of a stress-neutral plane is relatively small even when the semiconductor modules 20 are mounted onto the radiator 34. Thus, a stress-neutral plane of the radiator 34 on which the semiconductor modules 20 are mounted is located adjacent to the central portion of the radiator 34 in the direction of thickness of the radiator 34 (in the direction parallel to Y axis). Thus, the semiconductor apparatus 14 according to the fourth variation of embodiment 1 of the present invention has a similar effect to that of the semiconductor apparatus 10 according to embodiment 1 of the present invention.

According to the semiconductor apparatus 14 of the fourth variation of embodiment 1 of the present invention, as described above, the semiconductor module mount-surfaces 34B1 and 34B2 are located in the first main surface 34B in a zigzag pattern in cross-sectional view, and the semiconductor module mount-surfaces 34C1 and 34C2 are located in the second main surface 34C in zigzag pattern in cross-sectional view. Further, plural of the semiconductor modules 20 are mounted onto the semiconductor module mount-surface 34B1. Thus the volume of a portion of the radiator 34 lower than the semiconductor module mount-surfaces 34B1 becomes smaller than that of the radiator 310, and it becomes possible to reduce the stress which causes the warping of the radiator 34 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 14 of the fourth variation of embodiment 1 of the present invention, the stress-neutral plane of the semiconductor apparatus 14 is located adjacent to the central portion of the radiator 34 in the direction of thickness of the radiator 34 (in the direction parallel to Y axis). Thus the warping of the radiator 34 included in the semiconductor apparatus 14 can be reduced, and it becomes possible to reduce the stress which causes the warping of the radiator 34 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 14 of the fourth variation of embodiment 1 of the present invention, the radiator 34 includes steps in boundaries between the concave portions, of the first main surfaces 34B and the second main surfaces 34C, and the convex portions located adjacent to the concave portions. Since the steps of the radiator 34 perform like springs, the steps absorb the warping of the radiator 34. It becomes possible to reduce further the stress which causes the warping of the radiator 34 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

<Embodiment 2>

Figure 8:
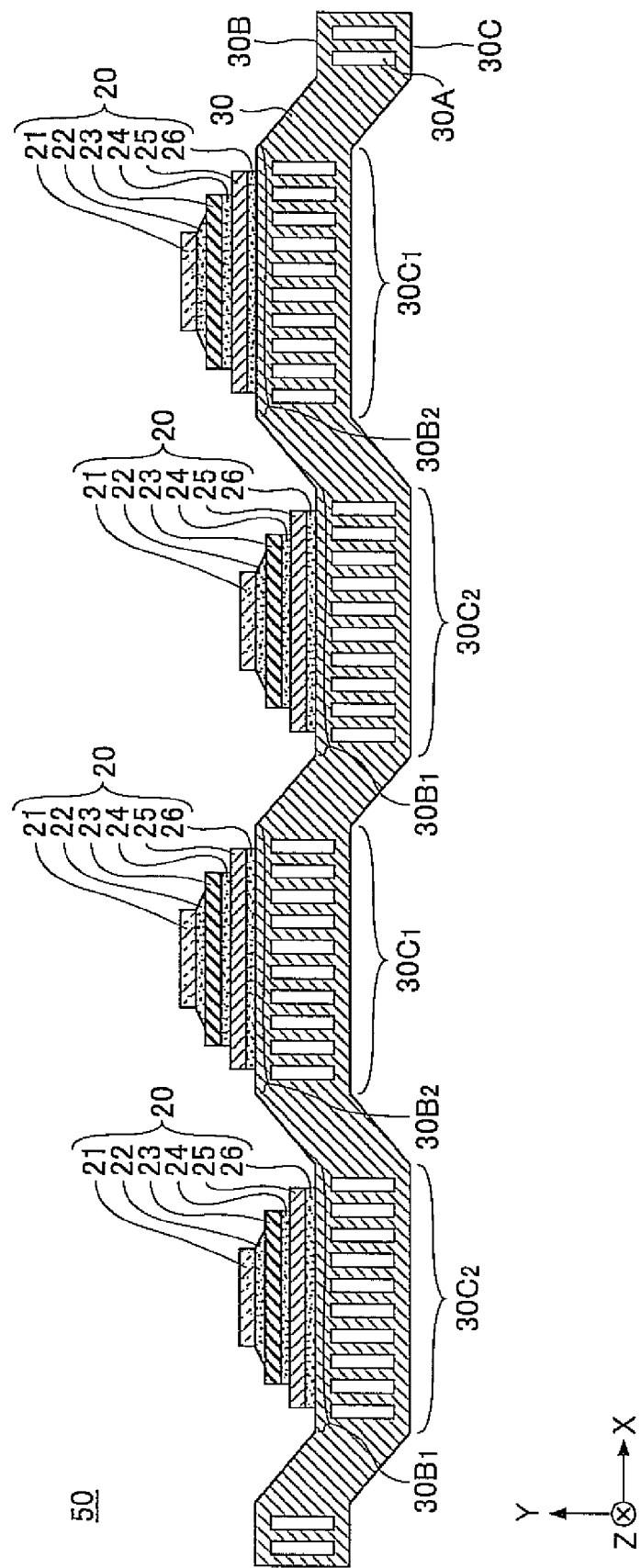
FIG. 8 shows an exemplary cross-sectional view of a semiconductor apparatus 50 according to embodiment 2 of the present invention.

FIG. 8 shows an exemplary cross-sectional view of the semiconductor apparatus 50 according to embodiment 2 of the present invention. With regard to FIG. 8, the same elements as or similar elements to those of semiconductor apparatus 10 as shown in FIG. 1 are referred to by the same reference numerals, and a description thereof may be omitted. Hereinafter, differences between the semiconductor apparatus 50 according to embodiment 2 of the present invention and the semiconductor apparatus 10 according to embodiment 1 will be described.

As shown in FIG. 8, the semiconductor apparatus 50 is different from the semiconductor apparatus 10 as shown in FIG. 1 only in that plural of the semiconductor modules 20 are mounted onto the semiconductor module mount-surfaces 30B1 and 30B2. As plural of the semiconductor modules 20 are mounted onto not only the semiconductor module mount-surfaces 30B1 but also the semiconductor module mount-surfaces 30B2, the stress-neutral plane of the semiconductor apparatus 50 shifts further to the upper side (positive side in the direction of Y axis) compared to the stress-neutral plane 41 as shown in FIG. 3B.

However, the stress-neutral plane of the radiator 30 by itself is located near the central portion of the radiator 30 in the direction of thickness of the radiator 30 (in the direction parallel to Y axis), and the volume of the radiator 30 is much larger than the volume of the semiconductor modules 20. As a result, a shift amount of a stress-neutral plane is relatively small even when the semiconductor modules 20 are mounted onto the radiator 30. Thus, a stress-neutral plane of the radiator 30 on which the semiconductor modules 20 are mounted remains adjacent to the central portion of the radiator 30 in the direction of thickness of the radiator 30 (in the direction parallel to Y axis).

The volume of the space, which is sandwiched by the semiconductor module mount-surface 30B1 of the first main surface 30B and the semiconductor module mount-surface 30C2 of the second main surface 30C, and the volume of the space, which is sandwiched by the semiconductor module mount-surface 30B2 of the first main surface 30B and the semiconductor module mount-surface 30C1 of the second main surface 30C, are smaller than the volume of the space which is sandwiched by the first main surface 300B and the second main surface 300C of the conventional semiconductor apparatus 100 as shown in FIG. 2A. Thus, the stress which causes the radiator 30 to warp is weaker than the stress which causes the radiator 300 to warp. Thus, the semiconductor apparatus 50 according to embodiment 2 of the present invention has a similar effect to that of the semiconductor apparatus 10 according to embodiment 1 of the present invention.

According to the semiconductor apparatus 50 of embodiment 2 of the present invention, as described above, the semiconductor module mount-surfaces 30B1 and 30B2 are located in the first main surface 30B in a zigzag pattern in cross-sectional view, and the semiconductor module mount-surfaces 30C1 and 30C2 are located in the second main surface 30C in a zigzag pattern in cross-sectional view. Further, plural of the semiconductor modules 20 are mounted onto plural of the semiconductor module mount-surface 30B1 and plural of the semiconductor module mount-surface 30B2. Thus the volume of a portion of the radiator 30 lower than the semiconductor module mount-surfaces 30B1 and 30B2 becomes smaller than that of the radiator 300, and it becomes possible to reduce the stress which causes the warping of the radiator 30 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 50 of embodiment 2 of the present invention, the stress-neutral plane of the semiconductor apparatus 50 is located adjacent to the central portion of the radiator 30 in the direction of thickness of the radiator 30 (in the direction parallel to Y axis). Thus the warping of the radiator 30 included in the semiconductor apparatus 50 can be reduced, and it becomes possible to reduce the stress which causes the warping of the radiator 30 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

Herein, it is possible to apply variations similar to the first to fourth variations of embodiment 1 to the semiconductor apparatus 50 according to embodiment 2, and to obtain effects similar to the cases in which the first to fourth variations are applied to the semiconductor apparatus 10 according to embodiment 1 of the present invention.

<Embodiment 3>

Figure 9:
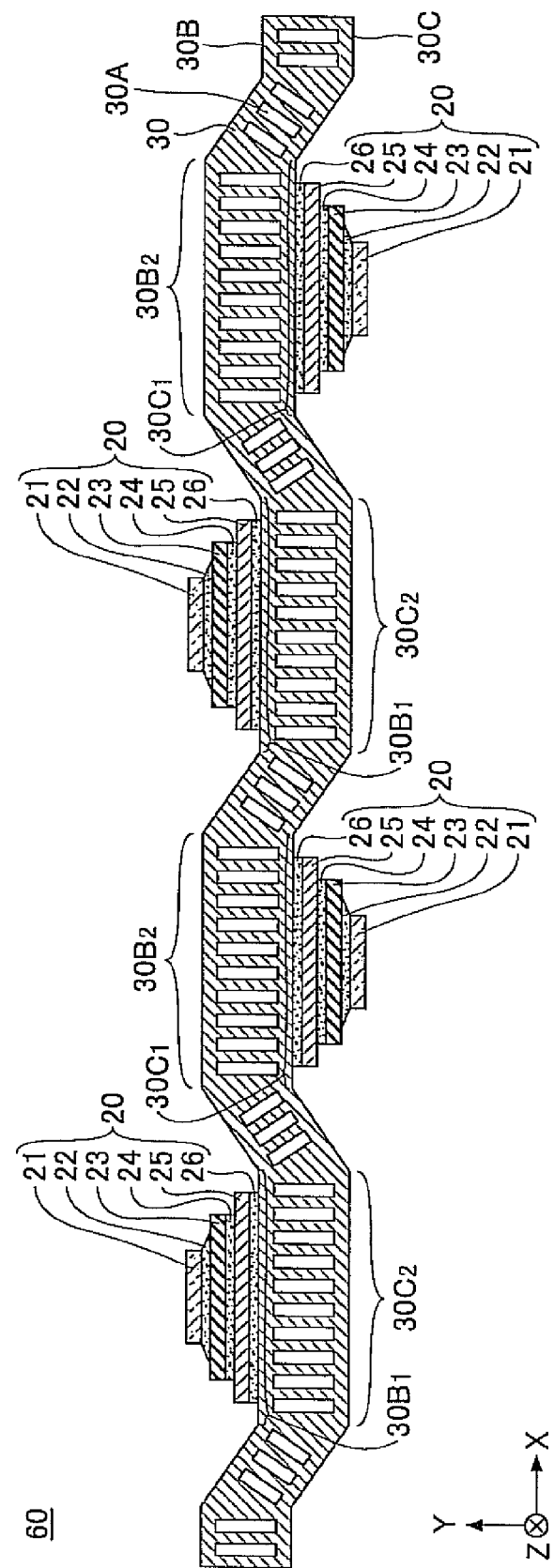
FIG. 9 shows an exemplary cross-sectional view of a semiconductor apparatus 60 according to embodiment 3 of the present invention.

FIG. 9 shows an exemplary cross-sectional view of the semiconductor apparatus 60 according to embodiment 3 of the present invention. With regard to FIG. 9, the same elements as or similar elements to those of semiconductor apparatus 10 as shown in FIG. 1 are referred to by the same reference numerals, and a description thereof may be omitted. Hereinafter, differences between the semiconductor apparatus 60 according to embodiment 3 of the present invention and the semiconductor apparatus 10 according to embodiment 1 will be described.

As shown in FIG. 9, the semiconductor apparatus 60 is different from the semiconductor apparatus 10 as shown in FIG. 1 only in that plural of the semiconductor modules 20 are mounted onto the semiconductor module mount-surfaces 30B1 of the first main surface 30B and the semiconductor module mount-surfaces 30C1 of the second main surface 30C. As plural of the semiconductor modules 20 are mounted onto the semiconductor module mount-surfaces 30B1 of the first main surface 30B and the semiconductor module mount-surfaces 30C1 of the second main surface 300, the stress-neutral plane of the semiconductor apparatus 60 is located at almost the same position as the stress-neutral plane 40 as shown in FIG. 3B.

The reasons why this is achieved will be discussed below. Since the shape of the radiator 30 of the semiconductor apparatus 60 is almost symmetrical about a point, the stress-neutral plane 40 of the radiator 30 by itself is located near the central portion of the radiator 30 in the direction of thickness of the radiator 30 (in the direction parallel to Y axis). Since plural of the semiconductor modules 20 are mounted onto the semiconductor module mount-surfaces 30B1 of the first main surface 30B and the semiconductor module mount-surfaces 30C1 of the second main surface 30C, the shape of the semiconductor apparatus 60 is almost symmetrical about a point similar to the shape of the radiator 30 by itself. Thus, the stress-neutral plane 40 of the radiator 30 shifts very little.

The volume of the space, which is sandwiched by the semiconductor module mount-surface 30B1 of the first main surface 30B and the semiconductor module mount-surface 30C2 of the second main surface 30C, and the volume of the space, which is sandwiched by the semiconductor module mount-surface 30B2 of the first main surface 30B and the semiconductor module mount-surface 30C1 of the second main surface 30C, are smaller than the volume of the space which is sandwiched by the first main surface 300B and the second main surface 300C of the conventional semiconductor apparatus 100 as shown in FIG. 2A. Thus, the stress which causes the radiator 30 to warp is weaker than the stress which causes the radiator 300 to warp. Thus, the semiconductor apparatus 60 according to embodiment 3 of the present invention has a similar effect to that of the semiconductor apparatus 10 according to embodiment 1 of the present invention.

According to the semiconductor apparatus 60 of embodiment 3 of the present invention, as described above, the semiconductor module mount-surfaces 30B1 and 30B2 are located in the first main surface 30B in a zigzag pattern in cross-sectional view, and the semiconductor module mount-surfaces 30C1 and 30C2 are located in the second main surface 30C in a zigzag pattern in cross-sectional view. Further, plural of the semiconductor modules 20 are mounted onto plural of the semiconductor module mount-surface 30B1 and plural of the semiconductor module mount-surface 30C1. Thus the volume of a portion of the radiator 30 lower than the semiconductor module mount-surfaces 30B1 and the volume of a portion of the radiator 30 higher than the semiconductor module mount-surfaces 30C1 become smaller than that of the radiator 300, and it becomes possible to reduce the stress which causes the warping of the radiator 30 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

According to the semiconductor apparatus 60 of embodiment 3 of the present invention, the stress-neutral plane of the semiconductor apparatus 60 is located near the central portion of the radiator 30 in the direction of thickness of the radiator 30 (in the direction parallel to Y axis). As a result, the warping in the positive direction of Y axis and the warping in the negative direction of Y axis are balanced, and the warping as a whole appears very little. It becomes possible to greatly reduce the stress which causes the warping of the radiator 30 and is caused by heat. As a result, the stress which is applied to the semiconductor elements 21, the first bonding material 22, the insulated substrates 23, the second bonding material 24, the radiator plates 25 and the third bonding material 26 can be reduced. It becomes possible to suppress generation of cracks in the semiconductor elements 21, the first bonding material 22, the insulated substrates 23, the second bonding material 24, the radiator plates 25 and the third bonding material 26, even when the solder or the braze, which does not have flexibility, is used as the bonding material.

Since plural of the semiconductor modules 20 are mounted onto the semiconductor module mount-surfaces 30B1 of the first main surface 30B and the semiconductor module mount-surfaces 30C1 of the second main surface 30C, it becomes possible to make the semiconductor apparatus 60 of embodiment 3 of the present invention thinner than the semiconductor apparatus 50 of embodiment 2 of the present invention in the direction parallel to Y axis.

Herein, it is possible to apply variations similar to the first to fourth variations of embodiment 1 to the semiconductor apparatus 60 according to embodiment 3, and to obtain effects similar to the cases in which the first to fourth variations are applied to the semiconductor apparatus 10 according to embodiment 1 of the present invention.

Although, the preferred embodiments and the variations thereof are described in detail, the present invention is not limited to these embodiments, but variations and modifications may be made without departing from the scope of the present invention.

For example, as described above, although the radiators included in the semiconductor apparatuses according to the embodiments and variations of the present invention include the four first main surfaces and the four second main surfaces, the number of the first main surface and the second main surface are not limited to four. The number of the first main surface and the second main surface may be n (n≧2).

Although, as described above, the semiconductor modules include the semiconductor elements, the first bonding material, the insulated substrate, the second bonding material, the radiator plates and the third bonding material, the present invention is characterized by the shape of the radiator. Thus, the present invention has designated effects as described above with regard to the embodiments and the variations, without being affected by the configuration of the semiconductor modules. Thus, the configuration the semiconductor modules is not limited to those described in the embodiments and the variations of the present invention.

The semiconductor modules may be mounted onto the first main surface and the second main surface included in the radiator of the semiconductor apparatus of the present invention in a way other than illustrated in the embodiments and variations. For example, the semiconductor modules may be mounted onto all of the semiconductor module mount-surfaces of the first main surface and part of the semiconductor module mount-surface of the second main surface. Alternatively, the semiconductor modules may be mounted onto all of the semiconductor module mount-surfaces of the first main surface and the semiconductor module mount-surfaces of the second main surface.

Although, in the embodiments and the variations as described above, the semiconductor apparatus includes plural of the same semiconductor modules that are mounted onto the radiator, the semiconductor apparatus may include various types of semiconductor modules that are mounted onto the radiator.

Although, it is preferable to equalize the length in X axis direction of the bottom surfaces of the concave portions in cross-sectional view and the length in X axis direction of the top surfaces of the convex portions in the first main surface, and the length in X axis direction of the bottom surfaces of the concave portions in cross-sectional view and the length in X axis direction of the top surfaces of the convex portions in the second main surface, the length in X axis direction of the bottom surfaces of the concave portions in cross-sectional view and the length in X axis direction of the top surfaces of the convex portions in the first main surface may be different from the length in X axis direction of the bottom surfaces of the concave portions in cross-sectional view and the length in X axis direction of the top surfaces of the convex portions in the second main surface. In such a case, the designated effect which is described with regard to the embodiments and the variations of the present invention can be obtained, as long as the stress-neutral plane is located closer to the central portion of the radiator than the stress-neutral plane of the radiator included in the conventional semiconductor apparatus.

The shape of the boundaries between the concave portions, of the first main surfaces and the second main surfaces, and the convex portions located adjacent to the concave portions included in the semiconductor apparatus of the present invention is not limited to the shapes as illustrated in the embodiments and the variations of the present invention.

Although the radiators of the semiconductor apparatuses of the present invention include fins that have designated shapes between adjacent flow paths of the cooling medium, the present invention has designated effects as described above with regard to the embodiments and the variations regardless of the shape of the fins. Thus, the shape of the fins may be varied to any shapes.

The present application is based on Japanese Priority Application No. 2008-219426 filed on Aug. 28, 2008 with the Japanese Patent Office, the entire contents of which are hereby incorporated by reference.

Description of Reference Numerals 10, 11, 12, 13, 14, 50, 60, 100, 110 semiconductor apparatus
20 semiconductor module
21 semiconductor element
22 first bonding material
23 insulated substrate
24 second bonding material
25 radiator plate
26 third bonding material
30, 31, 32, 33, 34, 300, 310 radiator
30A, 31A, 32A, 33A, 34A, 310A flow path
30B first main surface of the radiator 30
30B1, 30B2 semiconductor module mount-surface arranged in the first main surface 30B
30C second main surface of the radiator 30
30C1, 30C2 semiconductor module mount-surface arranged in the second main surface 30C
31B first main surface of the radiator 31
31B1, 31B2 semiconductor module mount-surface arranged in the first main surface 31B
31C second main surface of the radiator 31
31C1, 31C2 semiconductor module mount-surface arranged in the second main surface 31C
32B first main surface of the radiator 32
32B1, 32B2 semiconductor module mount-surface arranged in the first main surface 32B
32C second main surface of the radiator 32
32C1, 32C2 semiconductor module mount-surface arranged in the second main surface 32C
33B first main surface of the radiator 33
33B1, 33B2 semiconductor module mount-surface arranged in the first main surface 33B
33C second main surface of the radiator 33
33C1, 33C2 semiconductor module mount-surface arranged in the second main surface 33C
34B first main surface of the radiator 34
34B1, 34B2 semiconductor module mount-surface arranged in the first main surface 34B
34C second main surface of the radiator 34
34C1, 34C2 semiconductor module mount-surface arranged in the second main surface 34C
40 stress-neutral plane of the radiator 30
41 stress-neutral plane of the semiconductor apparatus 10
300B first main surface of the radiator 300
300C second main surface of the radiator 300
400 stress-neutral plane of the radiator 300
410 stress-neutral plane of the semiconductor apparatus 100

The invention claimed is:

1. A semiconductor apparatus comprising:
a radiator on which a plurality of semiconductor modules are mounted, each of the semiconductor modules include semiconductor elements;
the radiator including a first main surface and a second main surface opposite the first main surface, wherein semiconductor module mount-surfaces are arranged in the first main surface and the second main surface in a zigzag pattern in cross-sectional view; and
wherein the semiconductor modules are mounted only onto the semiconductor module mount-surfaces located in bottom surfaces of concave portions of the first main surface in cross-sectional view, or mounted only onto the semiconductor module mount-surfaces located in bottom surfaces of concave portions of the second main surface in cross-sectional view.

2. The semiconductor apparatus according to claim 1, wherein a cross-sectional shape of the radiator is almost symmetrical about a point.

3. The semiconductor apparatus according to claim 1, wherein a volume of one side of a stress-neutral plane of the radiator is almost equal to a volume of the other side of the stress-neutral plane of the radiator.

4. The semiconductor apparatus according to claim 1, wherein the semiconductor module mount-surfaces are formed periodically.

5. The semiconductor apparatus according to claim 1, wherein shapes of boundaries between the concave portions of the first main surfaces and the second main surfaces in cross-sectional view, and the convex portions located adjacent to the concave portions in cross-sectional view are step-like shapes.

6. The semiconductor apparatus according to claim 1, wherein the semiconductor module includes the semiconductor element, an insulated substrate, a radiator plate and bonding material configured to be bonded therebetween.

7. The semiconductor apparatus according to claim 6, wherein the bonding materials are constituted of solder or braze.

8. A semiconductor apparatus comprising:
a radiator on which a plurality of semiconductor modules are mounted, each of the semiconductor modules include semiconductor elements;
the radiator including a first main surface and a second main surface opposite the first main surface, wherein semiconductor module mount-surfaces are arranged in the first main surface and the second main surface in a zigzag pattern in cross-sectional view; and
wherein the semiconductor modules are mounted onto the semiconductor module mount-surfaces located in bottom surfaces of concave portions and the semiconductor module mount-surfaces located in top surfaces of convex portions of the first main surface in cross-sectional view, or mounted onto the semiconductor module mount-surfaces located in bottom surfaces of concave portions and the semiconductor module mount-surfaces located in top surfaces of convex portions of the second main surface in cross-sectional view.

9. A semiconductor apparatus comprising:
a radiator on which a plurality of semiconductor modules are mounted, each of the semiconductor modules include semiconductor elements;
the radiator including a first main surface and a second main surface opposite the first main surface, wherein semiconductor module mount-surfaces are arranged in the first main surface and the second main surface in a zigzag pattern in cross-sectional view; and
wherein the semiconductor modules are mounted onto the semiconductor module mount-surfaces located in bottom surfaces of concave portions of the first main surface in cross-sectional view, and mounted onto the semiconductor module mount-surfaces located in bottom surfaces of concave portions of the second main surface in cross-sectional view.

* * * * *